United States Patent
Kume et al.

(10) Patent No.: US 10,520,816 B2
(45) Date of Patent: Dec. 31, 2019

(54) METHOD FOR FORMING RESIST PATTERN, METHOD FOR MANUFACTURING PRINTED WIRING BOARD, PHOTOSENSITIVE RESIN COMPOSITION FOR PROJECTION EXPOSURE AND PHOTOSENSITIVE ELEMENT

(71) Applicant: HITACHI CHEMICAL COMPANY, LTD., Tokyo (JP)

(72) Inventors: Masakazu Kume, Tokyo (JP); Momoko Munakata, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/313,232

(22) PCT Filed: Dec. 17, 2014

(86) PCT No.: PCT/JP2014/083421
§ 371 (c)(1),
(2) Date: Nov. 22, 2016

(87) PCT Pub. No.: WO2015/177947
PCT Pub. Date: Nov. 26, 2015

(65) Prior Publication Data
US 2017/0153551 A1    Jun. 1, 2017

(30) Foreign Application Priority Data

May 23, 2014    (JP) .................. 2014-106946

(51) Int. Cl.
| | | |
|---|---|---|
| *G03F 7/20* | (2006.01) |
| *G03F 7/30* | (2006.01) |
| *G03F 7/031* | (2006.01) |
| *G03F 7/032* | (2006.01) |
| *G03F 7/033* | (2006.01) |
| *G03F 7/26* | (2006.01) |
| *G03F 7/028* | (2006.01) |
| *H05K 3/18* | (2006.01) |
| *G03F 7/11* | (2006.01) |
| *G03F 7/16* | (2006.01) |
| *G03F 7/32* | (2006.01) |
| *H05K 3/06* | (2006.01) |
| *G03F 7/027* | (2006.01) |

(52) U.S. Cl.
CPC ............ *G03F 7/2008* (2013.01); *G03F 7/027* (2013.01); *G03F 7/028* (2013.01); *G03F 7/031* (2013.01); *G03F 7/032* (2013.01); *G03F 7/033* (2013.01); *G03F 7/11* (2013.01); *G03F 7/16* (2013.01); *G03F 7/168* (2013.01); *G03F 7/26* (2013.01); *G03F 7/30* (2013.01); *G03F 7/322* (2013.01); *H05K 3/064* (2013.01); *H05K 3/18* (2013.01); *H05K 3/184* (2013.01); *H05K 3/06* (2013.01)

(58) Field of Classification Search
CPC ... G03F 7/26; G03F 7/30; G03F 7/027; G03F 7/028; G03F 7/031; G03F 7/032; G03F 7/033
USPC .................................. 430/325, 281.1, 288.1
See application file for complete search history.

(56) References Cited

U.S. PATENT DOCUMENTS

| | | | | | |
|---|---|---|---|---|---|
| 4,816,379 | A * | 3/1989 | Bronstert | ................ | G03F 7/031 430/281.1 |
| 7,993,809 | B2 * | 8/2011 | Miyasaka | .................. | C08F 2/50 430/270.1 |
| 8,563,223 | B2 * | 10/2013 | Hata | ........................ | G03F 7/031 430/281.1 |
| 2005/0106510 | A1 * | 5/2005 | Gries | ....................... | G03F 7/322 430/434 |
| 2013/0266900 | A1 * | 10/2013 | Kubota | ..................... | G03F 7/09 430/285.1 |

FOREIGN PATENT DOCUMENTS

| | | |
|---|---|---|
| JP | 2002-023383 A | 1/2002 |
| JP | 2003-098663 A | 4/2003 |
| JP | 2009-145613 A | 7/2009 |
| JP | 2010-277031 A | 12/2010 |
| JP | 2012/137838 A1 | 10/2012 |
| JP | 2014-002285 A | 1/2014 |
| WO | 2009/078380 A1 | 6/2009 |
| WO | 2012/081680 A1 | 6/2012 |

OTHER PUBLICATIONS

International Preliminary Report on Patentability for WO Appln. No. PCT/JP2014/083421 dated Dec. 8, 2016 in English.

(Continued)

*Primary Examiner* — John S Chu
(74) *Attorney, Agent, or Firm* — Fitch, Even, Tabin & Flannery, LLP

(57) ABSTRACT

An object is to provide a method for forming a resist pattern able to form a resist pattern, in which the resist shape is favorable, the occurrence of resist footing can be reduced, and the adherence and the aspect ratio are improved; and provided is a method for forming a resist pattern comprising a step of forming a photosensitive resin layer on a substrate using a photosensitive resin composition for projection exposure; a step of exposing the photosensitive resin layer to active light projecting an image of a photomask through a lens; and a step of removing an unexposed part of the photosensitive resin layer from the substrate by development, wherein the photosensitive resin composition for projection exposure comprises an (A) binder polymer, a (B) photopolymerizing compound having an ethylenically unsaturated bond, and a (C) photopolymerization initiator; and a light transmittance of the photosensitive resin layer at a wavelength of 365 nm is not less than 58.0% and not more than 95.0%.

12 Claims, 4 Drawing Sheets

(56) References Cited

OTHER PUBLICATIONS

International Search Report for PCT/JP2014/083421 dated Mar. 31, 2015; English translation submitted herewith (5 Pages).

* cited by examiner (a)

(b)

(c)

(d)

(e)

(f)

METHOD FOR FORMING RESIST PATTERN, METHOD FOR MANUFACTURING PRINTED WIRING BOARD, PHOTOSENSITIVE RESIN COMPOSITION FOR PROJECTION EXPOSURE AND PHOTOSENSITIVE ELEMENT

TECHNICAL FIELD

The present invention relates to a method for forming a resist pattern using a photosensitive resin composition for projection exposure; a method for manufacturing a printed wiring board; a photosensitive resin composition for projection exposure; and a photosensitive element.

BACKGROUND ART

In the manufacturing field of a printed wiring board as a resist material to be used for etching, plating, etc. a photosensitive resin composition, and a photosensitive element (layered body) with a structure constituted with a layer formed using such a photosensitive resin composition (hereinafter also referred to as "photosensitive resin layer") layered on a support film, and a protection layer placed on the photosensitive resin layer have been heretofore widely used.

A printed wiring board is manufactured using the photosensitive element, for example, according to the following procedures. First of all, a photosensitive resin layer of the photosensitive element is laminated on a substrate for circuit formation such as a copper-clad laminate board. In doing so, lamination is performed such that the surface opposite to a surface in contact with a support film of a photosensitive resin layer (hereinafter also referred to as "upper surface" of a photosensitive resin layer) contacts tightly a surface, on which a circuit is to be formed, of the substrate for circuit formation. Therefore, in a case where a protection layer is placed on the upper surface of the photosensitive resin layer, the lamination work is carried out, while the protection layer is peeled off. Meanwhile, the lamination is conducted by compression bonding a photosensitive resin layer to a basis substrate for circuit formation with heating (normal pressure lamination method).

Next, a photosensitive resin layer is exposed in a pattern through a mask film, etc. In this case a support film is detached at an any timing before or after exposure. Thereafter, an unexposed part of the photosensitive resin layer is removed by dissolution or dispersion using a developing solution. Next, a conductor pattern is formed by carrying out an etching treatment, or a plating treatment, and finally a cured part of the photosensitive resin layer is detached and removed.

With respect to a technique for the pattern exposure, a projection exposure method has been recently introduced, by which a photosensitive resin layer is irradiated in a form of an image with active light projecting an image of a photomask through a lens for exposing a photosensitive resin layer. A projection exposure method is able to secure higher resolution, higher aspect ratio, and higher alignment compared to a contact exposure method using a mask film, etc. Therefore, in view of recent trend that a fine conductor pattern is required for a printed wiring board, a projection exposure method has drawn intense attention.

Meanwhile, in a projection exposure method, monochromatic light such as i line monochromatic light (365 nm) is used generally for obtaining a fine conductor pattern, and therefore compared to an exposure method using parallel light of ihg mixed lines the irradiation energy dose is small so that an exposure time tends to be longer. Further, although an exposure method using parallel light is based on a one-shot exposure method, a projection exposure method adopts a split exposure method, and therefore the overall exposure time tends to be further extended. Consequently, the illuminance of a projection exposure device is designed higher than that of a parallel light exposure device in order to shorten the overall exposure time, and the exposure time of a projection exposure device per exposure tends to become shorter than a parallel light exposure device.

In line with the development of a projection exposure method having such characteristics, a photosensitive resin composition able to form a resist pattern with superior adherence even by a projection exposure method providing a short exposure time per exposure has been considered (for example, see Patent Literature 1).

CITATION LIST

Patent Literature

Patent Literature 1: International Publication No. WO 2009/078380

SUMMARY OF INVENTION

Technical Problem

Since further micronization of a conductor pattern on a printed wiring board has been advancing recently, formation of a fine pattern for which the line width/space width (hereinafter also referred to as "L/S") is, for example, 10/10 or less (unit: µm) has been demanded, and further a photosensitive resin composition to be used for formation of such a fine pattern has been demanded to be able to form a resist pattern satisfying adequately the adherence. Further, in the field where formation of a thick conductor pattern is necessary, the L/S is not limited to 10/10 or less (unit: µm), but a photosensitive resin composition is required to be able to form a resist pattern with a high "aspect ratio", which is defined as "height of a formed image (resist)/width of a formed image (resist)".

Further, it is desired that a resist shape is rectangular, when a conductor pattern is formed on a printed wiring board, especially when a conductor pattern is formed through a plating step. In this regard, a resist shape means a cross-sectional shape, when a resist is sectioned in a plane parallel to the width direction and the height direction. If the resist shape is not rectangular, for example, if it has an inverted trapezoid shape (bobbin-shape), the shape of a plating deposited in a plating step becomes trapezoidal, so that the spacing at a plating base becomes narrow and the electrical property of a printed wiring board may be deteriorated.

Further, a resist base may be occasionally broadened by swelling in a development step in manufacturing a printed wiring board. In this case, as the result of drying after the development a residue remains at the resist base (also called as "resist footing") to increase a contact area between the resist base and a substrate, so that detachment of the resist from the substrate tends to become difficult. If the amount of the appeared residue is large, a contact area between plating and the substrate is reduced, which becomes a factor of decrease in the mechanical strength of a formed circuit. The influence of the residue becomes more significant, when a circuit formed on a printed wiring board is micronized to a higher degree, and especially when a conductor pattern with a L/S of 10/10 or less (unit: μm) is formed, if the amount of the appeared residue is large, formation of a conductor pattern itself may become difficult after plating. Therefore, a photosensitive resin composition able to form a resist pattern to generate a smaller amount of the appeared residue has been asked for.

With respect to the demands, by a method for forming a resist pattern using a projection exposure method described in Patent Literature 1, there appear the following drawbacks: the width difference between the upper part of a resist pattern and the base of the same becomes large, and satisfactory resist formation is hardly executable, the resist footing (residue at resist base) is apt to become long, and adequate adherence between a resist and a substrate is hardly secured.

The present invention was made in view of such drawbacks of the conventional art and an object thereof is to provide a method for forming a resist pattern, a method for manufacturing a printed wiring board, a photosensitive resin composition for projection exposure, and a photosensitive element, able to form a resist pattern, in which the resist shape is favorable, the occurrence of resist footing (generation of residue) can be reduced, and the adherence and the aspect ratio are improved, even when a resist pattern is formed using a projection exposure method.

Solution to Problem

For achieving the object, the present invention provides a method for forming a resist pattern comprising: a step of forming a photosensitive resin layer on a substrate using a photosensitive resin composition for projection exposure; a step of exposing the photosensitive resin layer to active light projecting an image of a photomask through a lens; and a step of removing an unexposed part of the photosensitive resin layer from the substrate by development; wherein the photosensitive resin composition for projection exposure comprises an (A) binder polymer, a (B) photopolymerizing compound having an ethylenically unsaturated bond, and a (C) photopolymerization initiator; and a light transmittance of the photosensitive resin layer at a wavelength of 365 nm is not less than 58.0% and not more than 95.0%.

By the method for forming a resist pattern, a resist pattern, in which the resist shape is favorable, the occurrence of resist footing can be reduced, and the adherence and the aspect ratio are improved, may be formed using the specific photosensitive resin layer by a projection exposure method. This is conceivably because the crosslink density at a base of a resist pattern may be increased by using a photosensitive resin layer containing the specific components and having a light transmittance at a wavelength of 365 nm of not less than 58.0% and not more than 95.0% despite a low exposure dose of a projection exposure method with a short exposure time per exposure, and as the result a favorable resist shape, reduction of the occurrence of resist footing, and improvement of the adherence and the aspect ratio can be achieved.

With respect to a method for forming a resist pattern according to the present invention, it is preferable that the content of the (C) photopolymerization initiator in the photosensitive resin composition be 0.01 to 30 parts by mass with respect to 100 parts by mass as the total of the (A) binder polymer, and the (B) photopolymerizing compound having an ethylenically unsaturated bond. By this means, the photosensitivity, the resolution, and the adherence may be further improved, and a resist pattern further superior in resist shape may be formed.

Further, with respect to a method for forming a resist pattern according to the present invention, it is preferable that the photosensitive resin composition for projection exposure further comprise a (D) sensitizing dye. By this means, a resist pattern further superior in photosensitivity, resolution, and resist shape may be formed.

Further, with respect to a method for forming a resist pattern according to the present invention, it is preferable that the content of the (D) sensitizing dye in the photosensitive resin composition be 0.01 to 10 parts by mass with respect to 100 parts by mass as the total of the (A) binder polymer, and the (B) photopolymerizing compound having an ethylenically unsaturated bond. By this means, a resist pattern, in which the photosensitivity and the resolution are higher, and a resist shape is further superior, may be formed.

Further, with respect to a method for forming a resist pattern according to the present invention, it is preferable that the (D) sensitizing dye be a pyrazoline. By this means, when a photosensitive resin layer is exposed especially to active light of 340 nm to 430 nm, the sensitivity and the adherence may be further improved, and the light absorption of the component (D) may be suppressed better.

The present invention provides also a method for manufacturing a printed wiring board comprising a step of forming a conductor pattern by performing an etching treatment or a plating treatment on a substrate with a resist pattern formed by the aforedescribed method for forming a resist pattern according to the present invention. By such a method for manufacturing a printed wiring board, since a resist pattern is formed by a method for forming a resist pattern according to the present invention, both a printed wiring board with a fine conductor pattern, and a printed wiring board having a thick film conductor pattern with a high aspect ratio can be easily manufactured.

The present invention provides also a photosensitive resin composition for projection exposure to be used for forming a photosensitive resin layer when a resist pattern is formed by exposing the photosensitive resin layer to active light projecting an image of a photomask through a lens; wherein the photosensitive resin composition for projection exposure comprises an (A) binder polymer, a (B) photopolymerizing compound having an ethylenically unsaturated bond, and a (C) photopolymerization initiator; and the light transmittance of the photosensitive resin layer at a wavelength of 365 nm is not less than 58.0% and not more than 95.0%.

With the photosensitive resin composition for projection exposure, a resist pattern, in which the resist shape is favorable, the occurrence of resist footing can be reduced, and the adherence and the aspect ratio are improved, may be formed by a projection exposure method.

Meanwhile, further with respect to a photosensitive resin composition for projection exposure according to the present invention, it is preferable that the content of the (C) photopolymerization initiator be 0.01 to 30 parts by mass with respect to 100 parts by mass as the total of the (A) binder polymer, and the (B) photopolymerizing compound having an ethylenically unsaturated bond. By this means, the photosensitivity, the resolution, and the adherence may be further improved, and a resist pattern further superior in resist shape may be formed.

It is preferable that the photosensitive resin composition for projection exposure according to the present invention further comprise a (D) sensitizing dye. By this means, a resist pattern further superior in photosensitivity, resolution, and resist shape may be formed.

Further, with respect to a photosensitive resin composition for projection exposure according to the present invention, it is preferable that the content of the (D) sensitizing dye be 0.01 to 10 parts by mass with respect to 100 parts by mass as the total of the (A) binder polymer, and the (B) photopolymerizing compound having an ethylenically unsaturated bond. By this means, a resist pattern, in which the photosensitivity and the resolution are higher, and a resist shape is further superior, may be formed.

Further, with respect to a photosensitive resin composition for projection exposure according to the present invention, it is preferable that the (D) sensitizing dye be a pyrazoline. By this means, when a photosensitive resin layer is exposed especially to active light of 340 nm to 430 nm, the sensitivity and the adherence may be further improved, and the light absorption of the component (D) may be suppressed better.

The present invention also provides a photosensitive element comprising a support, and a photosensitive resin layer formed on the support using the aforedescribed photosensitive resin composition for projection exposure according to the present invention. By such a photosensitive element, a resist pattern, in which the resist shape is favorable, the occurrence of resist footing can be reduced, and the adherence and the aspect ratio are improved, may be formed by a projection exposure method.

The present invention further provides a method for forming a resist pattern comprising a step of forming a photosensitive resin layer of the aforedescribed photosensitive element according to the present invention on a substrate; a step of exposing the photosensitive resin layer to active light projecting an image of a photomask through a lens; and a step of removing an unexposed part of the photosensitive resin layer from the substrate by development. By such a method for forming a resist pattern, a resist pattern, in which the resist shape is favorable, the occurrence of resist footing can be reduced, and the adherence and the aspect ratio are improved, may be formed by a projection exposure method.

Advantageous Effects of Invention

According to the present invention, a method for forming a resist pattern, a method for manufacturing a printed wiring board, a photosensitive resin composition for projection exposure, and a photosensitive element, able to form a resist pattern, in which the resist shape is favorable, the occurrence of resist footing (generation of residue) can be reduced, and the adherence and the aspect ratio are improved, even when a resist pattern is formed using a projection exposure method, may be provided.

DESCRIPTION OF EMBODIMENTS

Figure 1:
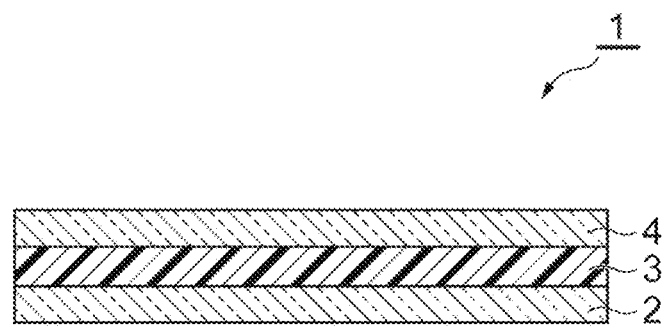
FIG. 1 is a schematic sectional view showing an embodiment of a photosensitive element according to the present invention.

Appropriate embodiments of the present invention will be described below in detail, where necessary referring to a drawing. Herein, (meth)acrylic acid means at least one of acrylic acid and methacrylic acid corresponding thereto; (meth)acrylate means at least one of acrylate and methacrylate corresponding thereto; and a (meth)acryloyl group means at least one of an acryloyl group and a methacryloyl group corresponding thereto.

The term "step" herein includes not only an independent step, but also a step which may not be clearly separated from another step, insofar as an intended function of the step can be attained. The term "layer" herein comprehends not only a structure having a shape in which it is formed over the whole surface when observed as a plan view, but also a structure having a shape in which it is formed only on a part of the same. Further, a numerical range that is expressed using "to" means a range including the numerical values described before and after the "to", respectively, as the minimum value and the maximum value.

<Method for Forming Resist Pattern>

A method for forming a resist pattern according to the present embodiment relates to a method for forming a resist pattern comprising (i) a step of forming a photosensitive resin layer on a substrate using a photosensitive resin composition for projection exposure (hereinafter also referred to as "photosensitive resin layer forming step"); (ii) a step of exposing the photosensitive resin layer to active light projecting an image of a photomask through a lens (hereinafter also referred to as "exposure step"); and (iii) a step of removing an unexposed part of the photosensitive resin layer from the substrate by development (hereinafter also referred to as "development step"; wherein the photosensitive resin composition for projection exposure comprises an (A) binder polymer, a (B) photopolymerizing compound having an ethylenically unsaturated bond, and a (C) photopolymerization initiator; and the light transmittance of the photosensitive resin layer at a wavelength of 365 nm is not less than 58.0% and not more than 95.0%. A method for forming a resist pattern according to the present embodiment may include, if necessary, other steps. Each step of a method for forming a resist pattern according to the present embodiment will be described below in detail.

(i) Photosensitive Resin Layer Forming Step

In a photosensitive resin layer forming step, a photosensitive resin layer is formed on a substrate using a photosensitive resin composition for projection exposure described below. Although there is no particular restriction on a substrate, ordinarily, a substrate for circuit formation provided with an insulation layer and a conductor layer formed on the insulation layer, or a die pad (base material for lead frame) such as an alloy base material is used.

Examples of a method for forming a photosensitive resin layer on a substrate include a method by which a coating liquid containing a photosensitive resin composition for projection exposure is coated on a substrate and then dried, and a method using a photosensitive element described below. By the method using a photosensitive element, a photosensitive resin layer of a photosensitive element is compression bonded, while being heated, on to a substrate, so that a layered body provided with a substrate, a photosensitive resin layer, and a support in the mentioned order is obtained. In the case of a photosensitive element with a protection layer, after removal of the protection layer, a photosensitive resin layer of the photosensitive element is compression bonded, while being heated, on to a substrate.

In a case where the photosensitive resin layer forming step is implemented using a photosensitive element, implementation under reduced pressure is preferable from the viewpoint of adherence and conformability. It is preferable that heating during compression bonding be performed at a temperature of 70 to 130° C., and it is preferable that compression bondingpressing be performed at a pressure of 0.1 to 1.0 MPa (1 to 10 kgfcm$^2$), but the above conditions may be selected appropriately according to need. If a photosensitive resin layer of a photosensitive element is heated to 70 to 130° C., there is no need for a pre-heating treatment on a substrate, but a substrate may be subjected to a pre-heating treatment for the sake of further improvement of adherence and conformability.

(ii) Exposure Step

In an exposure step a projection exposure method is adopted. Namely, in an exposure step, using active light projecting an image of a photomask, at least a part of a photosensitive resin layer formed on a substrate is irradiated with the active light through a lens, so that the irradiated part with the active light (hereinafter also referred to as "exposed part") can be photocured to form a photocured part (latent image). In a case where a photosensitive resin layer is formed with a photosensitive element described below, if a support present on the photosensitive resin layer is transparent with respect to active light, irradiation with active light through the support is possible, but if the support is opaque with respect to active light, the photosensitive resin layer is irradiated with active light after removal of the support.

Although it is preferable to use a projection exposure method alone from the viewpoint of enhancement of productivity, an exposure method other than a projection exposure method may be used in combination. Examples of an exposure method usable in combination include a method, by which irradiation is performed with active light shaped in an image form through a negative or positive mask pattern called as an artwork (mask exposure method), and a method, by which irradiation is performed with active light shaped in an image form through a direct drawing exposure method, such as a LDI (Laser Direct Imaging) exposure method, and a DLP (Digital Light Processing) exposure method.

There is no particular restriction on a light source for active light, insofar as it is an ordinarily used publicly known light source, and applicable examples thereof include a carbon-arc lamp, a mercury vapor arc lamp, an ultrahigh pressure mercury lamp, a high pressure mercury lamp, a xenon lamp, a gas laser such as an argon laser; those emitting ultraviolet light effectively, for example, a solid-state laser such as a UV (YAG) laser, and a semiconductor laser such as a gallium nitride blue-violet laser; and those emitting visible light effectively, for example, a flood bulb for photography, and a sun lamp. Among them, from the viewpoint of high resolution and high alignment, use of a light source able to emit i line monochromatic light with an exposure wavelength of 365 nm, a light source able to emit h line monochromatic light with an exposure wavelength of 405 nm, or a light source able to emit active light with exposure wavelengths of ihg mixed lines is preferable, and use of a light source able to emit i line monochromatic light with an exposure wavelength of 365 nm is more preferable. Examples of a light source able to emit i line monochromatic light with an exposure wavelength of 365 nm include an ultrahigh pressure mercury lamp, and a solid UV (YAG) laser. Examples of a light source able to emit h line monochromatic light with an exposure wavelength of 405 nm include a semiconductor (gallium nitride) laser, and examples of a light source able to emit active light with exposure wavelengths of ihg mixed lines include an ultrahigh pressure mercury lamp. Further, as a light source for active light, use of a high pressure mercury lamp, an ultrahigh pressure mercury lamp, and a semiconductor laser with an exposure wavelength of 365 nm is preferable from the viewpoint of the output power of a light source. Examples of a projection exposure device include a projection exposure device "UX-2240 SMXJ-01" (product name) produced by Ushio, Inc.

(iii) Development Step

In a development step, a part of the photosensitive resin layer not irradiated with active light (hereinafter also referred to as "unexposed part") is removed by development from a substrate. In the development step, a resist pattern composed of a photocured product of a photocured exposed part of the photosensitive resin layer is formed on a substrate. When a photosensitive resin layer is formed using a photosensitive element described below, if a support is present on the photosensitive resin layer, an unexposed part other than the exposed part is removed by development after removal of the support. As a development method, there are wet development and dry development.

In the case of wet development, development may be conducted by a publicly known wet development method using a developing solution corresponding to a photosensitive resin composition for projection exposure. Examples of a wet development method include a dip method, a puddle method, a high pressure spray method, and methods using blushing, slapping, scrubbing, rocking immersion or the like, and a high pressure spray method is most appropriate from the viewpoint of improvement of resolution. The wet development methods may be used singly or in combinations of two or more.

A developing solution may be selected appropriately corresponding to a constitution of a photosensitive resin composition for projection exposure, and examples thereof include an alkaline aqueous solution, and an organic solvent developing solution.

When used as a developing solution, an alkaline aqueous solution is preferable, because it is safe and stable, and easy to handle. Examples of a base for an alkaline aqueous solution to be used include an alkali hydroxide, such as a hydroxide of lithium, sodium, or potassium; an alkali carbonate, such as a carbonate or bicarbonate of lithium, sodium, potassium, or ammonium; an alkali metal phosphoric acid salt, such as potassium phosphate, and sodium phosphate; an alkali metal pyrophosphoric acid salt, such as sodium pyrophosphate, and potassium pyrophosphate; borax (sodium tetraborate); sodium metasilicate; tetramethylammonium hydroxide; ethanolamine, ethylenediamine; diethylenetriamine; 2-amino-2-hydroxymethyl-1,3-propanediol; 1,3-diamino-2-propanol; and morpholine.

As an alkaline aqueous solution, a 0.1 to 5 mass-% dilute solution of sodium carbonate, a 0.1 to 5 mass-% dilute solution of potassium carbonate, a 0.1 to 5 mass-% dilute solution of sodium hydroxide, a 0.1 to 5 mass-% dilute solution of sodium tetraborate, etc. are preferable. It is preferable that the pH of an alkaline aqueous solution be in a range of 9 to 11, and the temperature of an alkaline aqueous solution may be adjusted according to the developability of a photosensitive resin layer. In an alkaline aqueous solution, for example, a surfactant, an antifoaming agent, a small amount of organic solvent for promoting development may be mixed.

Examples of an organic solvent used in an organic solvent developing solution include 1,1,1-trichloroethane, N-methylpyrrolidone, N,N-dimethyl formamide, cyclohexanone, methyl isobutyl ketone, and γ-butyrolactone. It is preferable that the organic solvent be used as an organic solvent developing solution after adding water in a range of 1 to 20 mass-% from the viewpoint of prevention of ignition.

(Other Steps)

A method for forming a resist pattern according to the present embodiment may include, if necessary, other steps in addition to (i) the photosensitive resin layer forming step, (ii) the exposure step, and (iii) the development step. For example, a method for forming a resist pattern according to the present embodiment may further include a step of curing a resist pattern by heating between 60 and 250° C., or exposing at an exposure dose of 0.2 to 10 J/cm$^2$ according to need, after removal of an unexposed part in (iii) the development step.

Since the exposure time per exposure is short in the case of a projection exposure method, it is very difficult to enhance the crosslink density at a base of a resist pattern. In contrast, by a method for forming a resist pattern according to the present embodiment, an exposure dose sufficient to enhance the crosslink density even at a base of a resist pattern can be obtained, so that curing at a base of a resist pattern becomes sufficient, and a resist pattern, in which the resist shape is favorable, the occurrence of resist footing can be reduced, and the adherence and the aspect ratio are improved, may be formed. Consequently, a method for forming a resist pattern according to the present embodiment may be used favorably for manufacturing a printed wiring board, etc.

<Method for Manufacturing Printed Wiring Board>

A method for manufacturing a printed wiring board according to the present embodiment relates to a method for manufacturing a printed wiring board comprising a step of forming a conductor pattern by performing an etching treatment or a plating treatment on a substrate with a resist pattern formed by the method for forming a resist pattern. A method for manufacturing a printed wiring board according to the present embodiment may comprise, if necessary, other steps such as a resist removal step. A method for manufacturing a printed wiring board according to the present embodiment may be used favorably for forming a conductor pattern, and used especially favorably for forming a conductor pattern by a plating treatment. Each step of a method for manufacturing a printed wiring board according to the present embodiment will be described below in detail.

In an etching treatment, a resist pattern, which is formed on a substrate provided with a conductor layer, is used as a mask, and a conductor pattern is formed by removing by etching a conductor layer of a substrate not covered with the resist. A method of an etching treatment is selected appropriately in accordance with a conductor layer to be removed. Examples of an etching solution include a cupric chloride solution, a ferric chloride solution, an alkali etching solution, and a hydrogen peroxide etching solution; and use of a ferric chloride solution is preferable from the viewpoint of favorable etch factor.

Meanwhile, in a plating treatment, copper or a solder, etc. is plated on a conductor layer of a substrate not covered with a resist using a resist pattern formed on a substrate provided with a conductor layer as a mask. After the plating treatment, the resist is removed in a resist removal step described below, and then a conductor layer having been covered with the resist is etched to form a conductor pattern. A method of an etching treatment to be applied then may be selected appropriately in accordance with a conductor layer to be removed, and for example the aforedescribed etching solution may be applied.

Although either of an electrolytic plating treatment and an electroless plating treatment may be used as a method for a plating treatment, an electroless plating treatment is preferable. Examples of an electroless plating treatment include copper plating, such as copper sulfate plating, and copper pyrophosphate plating; solder plating, such as high throw solder plating; nickel plating, such as Watts bath (nickel sulfate-nickel chloride) plating, and nickel sulfamate plating; and gold plating, such as hard gold plating, and soft gold plating.

In a resist removal step, a resist pattern on a substrate is removed after the etching treatment or the plating treatment. For removing the resist pattern, an alkaline aqueous solution stronger than the alkaline aqueous solution used in the development step may be used for detachment and removal. As the strong alkaline aqueous solution, for example, a 1 to 10 mass-% sodium hydroxide aqueous solution, or a 1 to 10 mass-% potassium hydroxide aqueous solution may be used. Among others, use of a 1 to 5 mass-% sodium hydroxide aqueous solution or potassium hydroxide aqueous solution is preferable.

Examples of a method for removing a resist pattern include a dip method and a spray method, which may be used singly or in combinations of two.

A method for manufacturing a printed wiring board according to the present embodiment may be applied not only to manufacture of a monolayer printed wiring board, but also to manufacture of a multilayer printed wiring board, and also applied to manufacture of a printed wiring board with a small diameter through-hole.

A method for manufacturing a printed wiring board according to the present embodiment may be used favorably for manufacturing a high density package substrate, especially for manufacturing a wiring board by a semi-additive process. An example of a process for manufacturing a wiring board by a semi-additive process will be described below referring to FIG. 2.

Figure 2:
FIG. 2 is a schematic perspective view showing an example of a manufacturing process for a printed wiring board by a semi-additive process.
Figure 2:
Figure 2:
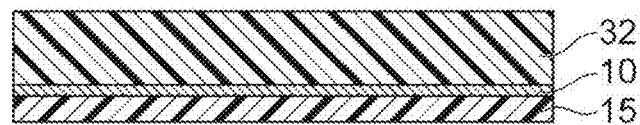
Figure 2:
Figure 2:
Figure 2:
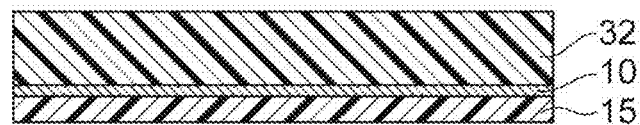
Figure 2:
Figure 2:
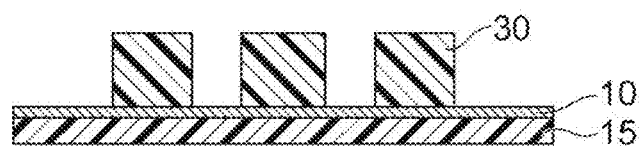
Figure 2:
Figure 2:
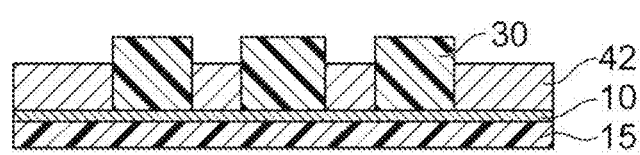
Figure 2:
Figure 2:

In FIG. 2(a), a substrate (substrate for circuit formation) with a conductor layer 10 formed on an insulation layer 15 is prepared. The conductor layer 10 is, for example, a metal copper layer. In FIG. 2(b), a photosensitive resin layer 32 for projection exposure is formed on the conductor layer 10 on the substrate by the photosensitive resin layer forming step. In FIG. 2(c), the photosensitive resin layer 32 for projection exposure is irradiated with (exposed to) active light 50 projecting an image of a photomask by the exposure step to form a photocured part in the photosensitive resin layer 32 for projection exposure. In FIG. 2(d), a region other than the photocured part of the photosensitive resin layer 32 for projection exposure is removed from the substrate to form a resist pattern 30, which is the photocured part, on the substrate by the development step. In FIG. 2(e), by a plating treatment using the resist pattern 30, which is the photocured part, as a mask, a plated layer 42 is formed on the conductor layer 10 of the substrate not covered with the resist. In FIG. 2(f), the resist pattern 30, which is the photocured part, is detached by a strong alkali aqueous solution and then a part of the plated layer 42 and the conductor layer 10 having been masked with the resist pattern 30 are removed by a flash etching treatment to form a circuit pattern 40. The materials for the conductor layer 10 and the plated layer 42 may be the same or different; if the conductor layer 10 and the plated layer 42 are composed of the same material, the conductor layer 10 and the plated layer 42 are integrated. Although in FIG. 2 a projection exposure method is described, a resist pattern 30 may be formed utilizing also a mask exposure method, or a direct drawing exposure method in combination.

<Photosensitive Resin Composition for Projection Exposure>

A photosensitive resin composition for projection exposure according to the present embodiment relates to a photosensitive resin composition for projection exposure to be used for forming a photosensitive resin layer when a resist pattern is formed by exposing the photosensitive resin layer to active light projecting an image of a photomask through a lens; wherein the photosensitive resin composition for projection exposure comprises an (A) binder polymer, a (B) photopolymerizing compound having an ethylenically unsaturated bond, and a (C) photopolymerization initiator; and the light transmittance of the photosensitive resin layer at a wavelength of 365 nm is not less than 58.0% and not more than 95.0%. A photosensitive resin composition for projection exposure according to the present embodiment will be described below in detail.

[(A) Binder Polymer]

As an (A) binder polymer (hereinafter also referred to as "component (A)"), those able to form a photosensitive resin layer with a light transmittance not less than 58.0% and not more than 95.0% at a wavelength of 365 nm may be used without any particular restriction, and examples thereof include an acrylic resin, a styrenic resin, an epoxy resin, an amide resin, an amide epoxy resin, an alkyd resin, and a phenolic resin. An acrylic resin is preferable from the viewpoint of alkali developability. They may be used singly or in combinations of two or more.

An (A) binder polymer may be produced, for example, by radical polymerization of a polymerizable monomer. Examples of a polymerizable monomer include styrene, vinyltoluene, a polymerizable styrene derivative substituted at α-position or an aromatic ring such as α-methyl styrene, an acrylamide such as diacetone acrylamide, acrylonitrile, an ether of vinyl alcohol such as n-butyl vinyl ether, a (meth)acrylic acid alkyl ester, (meth)acrylic acid benzyl ester, phenoxyethyl methacrylate, (meth)acrylic acid tetrahydrofurfuryl ester, (meth)acrylic acid dimethylaminoethyl ester, (meth)acrylic acid diethylaminoethyl ester, (meth)acrylic acid glycidyl ester, 2,2,2-trifluoroethyl (meth)acrylate, 2,2,3,3-tetrafluoropropyl (meth)acrylate, (meth)acrylic acid, α-bromoacrylic acid, α-chloroacrylic acid, β-furil (meth)acrylic acid, β-styryl (meth)acrylic acid, maleic acid, maleic anhydride, a maleic acid monoester, such as monomethyl maleate, monoethyl maleate, and monoisopropyl maleate, fumaric acid, cinnamic acid, α-cyanocinnamic acid, itaconic acid, crotonic acid, and propiolic acid. They may be used singly or in combinations of two or more.

Among the above, a (meth)acrylic acid alkyl ester is preferable. Examples of a (meth)acrylic acid alkyl ester include compounds expressed by the following formula (I), and a compound derived by substituting an alkyl group of the compounds with a hydroxy group, an epoxy group, a halogen group, etc.

$$H_2C=C(R^6)-COOR^7 \quad (I)$$

In formula (I), $R^6$ represents a hydrogen atom, or a methyl group, and $R^7$ represents an alkyl group having 1 to 12 carbon atoms. Examples of an alkyl group having 1 to 12 carbon atoms expressed by $R^7$ include a methyl group, an ethyl group, a propyl group, a butyl group, a pentyl group, a hexyl group, a heptyl group, an octyl group, a nonyl group, a decyl group, an undecyl group, a dodecyl group, and constitutional isomers thereof.

Examples of a (meth)acrylic acid alkyl ester expressed by formula (I) include (meth)acrylic acid methyl ester, (meth)acrylic acid ethyl ester, (meth)acrylic acid propyl ester, (meth)acrylic acid butyl ester, (meth)acrylic acid pentyl ester, (meth)acrylic acid hexyl ester, (meth)acrylic acid heptyl ester, (meth)acrylic acid octyl ester, (meth)acrylic acid 2-ethylhexyl ester, (meth)acrylic acid nonyl ester, (meth)acrylic acid decyl ester, (meth)acrylic acid undecyl ester, and (meth)acrylic acid dodecyl ester. They may be used singly or in combinations of two or more.

It is preferable that an (A) binder polymer contain a carboxyl group from the viewpoint of alkali developability. An (A) binder polymer containing a carboxyl group may be produced, for example, by radical polymerization of a polymerizable monomer having a carboxyl group and another polymerizable monomer. As a polymerizable monomer having a carboxyl group, a (meth)acrylic acid is preferable and methacrylic acid is more preferable. It is preferable that the acid value of an (A) binder polymer containing a carboxyl group be 50 to 250 mgKOH/g.

It is preferable that the blend rate of a polymerizable monomer having a carboxyl group with respect to the total mass of polymerizable monomers to be used for an (A) binder polymer be 12 to 50 mass-% from the viewpoint of the balance of alkali developability and alkali resistance, 12 to 40 mass-% is more preferable, 15 to 35 mass-% is further preferable, and 15 to 30 mass-% is especially preferable. When the blend rate of a polymerizable monomer having a carboxyl group is 12 mass-% or more, the alkali developability tends to be improved, and when the same is 50 mass-% or less, the alkali resistance tends to be superior.

Since the content of a structural unit originated from a polymerizable monomer having a carboxyl group in an (A) binder polymer is correlated with the blend rate of the polymerizable monomer having a carboxyl group, a content of 12 to 50 mass-% is preferable, 12 to 40 mass-% is more preferable, 15 to 35 mass-% is further preferable, and 15 to 30 mass-% is especially preferable.

Further, from the viewpoint of adherence and chemical resistance, it is preferable that an (A) binder polymer contain styrene or a styrene derivative as a polymerizable monomer. It is preferable that the blend rate of styrene or a styrene derivative with respect to the total mass of polymerizable monomers to be used for an (A) binder polymer be 10 to 60 mass-% from the viewpoint of superior adherence and chemical resistance, and 15 to 50 mass-% is more preferable. When the blend rate of styrene or a styrene derivative is 10 mass-% or more, the adherence tends to be improved, and when the same is 60 mass-% or less, enlargement of a detached piece during development may be suppressed and prolongation of detachment time tends to be suppressed.

Since the content of a structural unit originated from styrene or a styrene derivative in an (A) binder polymer is correlated with the blend rate of styrene or a styrene derivative, a content of 10 to 60 mass-% is preferable, and 15 to 50 mass-% is more preferable.

The (A) binder polymers may be used singly or in combinations of two or more. Examples of (A) binder polymers to be used in a combination of 2 or more kinds include 2 or more kinds of binder polymers composed of different comonomers, 2 or more kinds of binder polymers with different weight-average molecular weights, and 2 or more kinds of binder polymers with different degrees of dispersion.

The (A) binder polymer may be produced using the above polymerizable monomer by a conventional method. Specifically, it may be produced, for example, by radical polymerization of a (meth)acrylic acid alkyl ester, (meth)acrylic acid, styrene, etc.

It is preferable that the weight-average molecular weight of an (A) binder polymer be 20000 to 300000 from the viewpoint of a balance of mechanical strength and alkali developability, 40000 to 150000 is more preferable, 40000 to 120000 is further preferable, and 50000 to 80000 is especially preferable. When the weight-average molecular weight of an (A) binder polymer is 20000 or more, the resistance to a developing solution tends to be improved, and when the same is 300000 or less, prolongation of a development time tends to be suppressed. In this regard, a weight-average molecular weight is measured by a gel permeation chromatography method (GPC) and is a value reduced according to a calibration curve based on standard polystyrene. The conditions for GPC are as follows.

(GPC Conditions)
Pump: Hitachi L-6000 Type (produced by Hitachi, Ltd.)
Column: Following 3 columns (column specifications: 10.7 mmϕ×300 mm, all produced by Hitachi Chemical Co., Ltd.)
Gelpack GL-R420
Gelpack GL-R430
Gelpack GL-R440
Eluent: tetrahydrofuran
Sample concentration: A sample is prepared by dissolving a 120 mg of an (A) binder polymer with a solid content of 50 mass-% in 5 mL of tetrahydrofuran. In this connection, a solid content herein means components in a composition except volatile substances such as water and a solvent described below. In other words, a solid content also includes a liquid, a paste, or a wax at room temperature near 25° C., and is not necessarily a solid. Further, a volatile substance means a substance, whose boiling point at the atmospheric pressure is 155° C. or less.
Measurement temperature: 25° C.
Flow rate: 2.05 mL/min
Detector: Hitachi L-3300 Type RI (produced by Hitachi, Ltd.)

It is preferable that the content of an (A) binder polymer in a photosensitive resin composition for projection exposure with respect to 100 parts by mass as the total of the component (A) and component (B) described below be 30 to 80 parts by mass, 40 to 75 parts by mass is more preferable, and 50 to 70 parts by mass is further preferable. When the content of a component (A) is in the range, the coating performance of a photosensitive resin composition for projection exposure and the strength of a photocured product thereof are improved.

[(B) Photopolymerizing Compound Having Ethylenically Unsaturated Bond]

There is no particular restriction on use of a (B) photopolymerizing compound having an ethylenically unsaturated bond (hereinafter also referred to as "component (B)"), insofar as it is a photopolymerizing compound having at least one ethylenically unsaturated bond in the molecule.

Examples of a component (B) include a compound obtained by reacting an α,β-unsaturated carboxylic acid with a polyhydric alcohol, a bisphenol A (meth)acrylate compound, a urethane monomer such as a (meth)acrylate compound having a urethane bond, nonyl phenoxy ethyleneoxy (meth)acrylate, nonyl phenoxy octaethyleneoxy (meth)acrylate, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate, and a (meth)acrylic acid alkyl ester. They may be used singly or in combinations of two or more.

Among the above, it is preferable that a component (B) include a bisphenol A (meth)acrylate compound from the viewpoint of well-balanced improvement of resolution, adherence, and suppressing capacity on the occurrence of resist footing. Preferable examples of a bisphenol A (meth)acrylate compound include a compound expressed by the following formula (II).

[Chemical Formula 1]

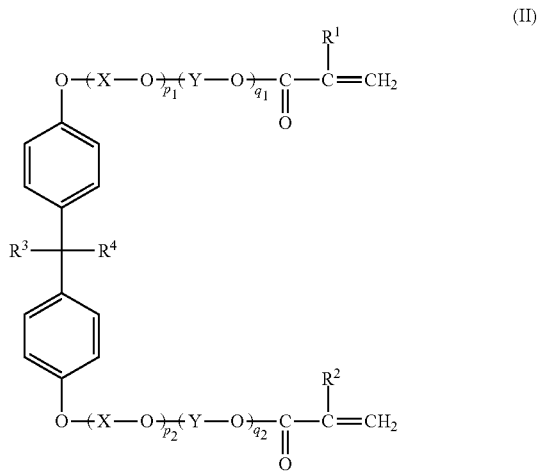

(II)

In formula (II), $R^1$, $R^2$, $R^3$, and $R^4$ represent independently a hydrogen atom, or a methyl group. X and Y represent independently an ethylene group, or a propylene group, and XO and YO represent independently an oxyethylene group, or an oxypropylene group. $p_1$, $p_2$, $q_1$, and $q_2$ represent independently a value between 0 and 40. However, $p_1+q_1$ and $p_2+q_2$ are both 1 or higher. In a case where X is an ethylene group, and Y is a propylene group, $p_1+p_2$ is 1 to 40, and $q_1+q_2$ is 0 to 20. In a case where X is a propylene group, and Y is an ethylene group, $p_1+p_2$ is 0 to 20, and $q_1+q_2$ is 1 to 40. Since $p_1$, $p_2$, $q_1$, and $q_2$ represent a number of structural units of an oxyethylene group or an oxypropylene group, the same shows for a single molecule an integer, and for an assembly of plural kinds of molecules a rational number as an average value.

In formula (II), in a case where X and Y are an ethylene group respectively, it is preferable that $p_1+p_2+q_1+q_2$ be 1 to 20 from the viewpoint of superior resolution and adherence, 1 to 10 is more preferable, and 1 to 7 is further preferable.

Examples of a compound expressed by formula (II) include 2,2-bis(4-((meth)acryloxypolyethoxy)phenyl)propane, 2,2-bis(4-((meth)acryloxypolypropoxy)phenyl)propane, 2,2-bis(4-((meth)acryloxypolybutoxy)phenyl)propane, and 2,2-bis(4-((meth)acryloxypolyethoxypolypropoxy)phenyl)propane. They may be used singly or in combinations of two or more.

Examples of a commercially available bisphenol A (meth) acrylate compound include 2,2-bis(4-((meth)acryloxydipropoxy)phenyl)propane ("BPE-200", produced by Shin-Nakamura Chemical Co., Ltd.), 2,2-bis(4-(methacryloxypentaethoxy)phenyl)propane ("BPE-5000", produced by Shin-Nakamura Chemical Co., Ltd., "FA-321M", produced by Hitachi Chemical Co., Ltd.), and 2,2-bis(4-

(methacryloxypentadecaethoxy)phenyl)propane ("BPE-1300", produced by Shin-Nakamura Chemical Co., Ltd.).

It is preferable that the content of a bisphenol A (meth) acrylate compound based on the total mass of the component (B) be 40 to 95 mass-%, 50 to 90 mass-% is more preferable, 60 to 90 mass-% is further preferable, and 70 to 90 mass-% is especially preferable. Further, it is preferable that the content of a bisphenol A (meth)acrylate compound based on the total mass of the component (A) and the component (B) be 5 to 50 mass-%, and 7 to 25 mass-% is more preferable.

It is preferable that the content of a component (B) with respect to 100 parts by mass as the total of the component (A) and the component (B) be 20 to 70 parts by mass, 25 to 60 parts by mass is more preferable, and 30 to 50 parts by mass is especially preferable. When the content of a component (B) is in the range, the resolution, adherence, and suppressing capacity on the occurrence of resist footing, as well as the photosensitivity and coating performance of a photosensitive resin composition are improved.

[(C) Photopolymerization Initiator]

There is no particular restriction on a (C) photopolymerization initiator (hereinafter also referred to as "component (C)"), insofar as it can polymerize the component (B), and appropriate one may be selected out of ordinarily used photopolymerization initiators.

Examples of the component (C) include an aromatic ketone, such as benzophenone, and 2-benzyl-2-dimethylamino-1-(4-morpholino phenyl)butanone-1,2-methyl-1-[4-(methylthio)phenyl]-2-morpholino-propanone-1; a quinone, such as an alkylanthraquinone; a benzoin ether compound, such as a benzoin alkyl ether; a benzoin compound, such as benzoin, and an alkyl benzoin; a benzyl derivative, such as benzyl dimethyl ketal; 2,4,5-triarylimidazole dimer, such as 2-(o-chlorophenyl)-4,5-diphenylimidazole dimer, and 2-(o-fluorophenyl)-4,5-diphenylimidazole dimer; and an acridine derivative, such as 9-phenylacridine, and 1,7-(9,9'-acridinyl) heptane. They may be used singly or in combinations of two or more.

Among the above, 2,4,5-triarylimidazole dimer is preferable. Examples of 2,4,5-triarylimidazole dimer include 2-(o-chlorophenyl)-4,5-diphenylimidazole dimer, 2-(o-chlorophenyl)-4,5-bis-(m-methoxyphenyl)imidazole dimer, and 2-(p-methoxyphenyl)-4,5-diphenylimidazole dimer. Among them 2-(o-chlorophenyl)-4,5-diphenylimidazole dimer is preferable.

Examples of a commercially available 2,4,5-triarylimidazole dimer include 2,2'-bis(2-chlorophenyl)-4,4',5,5'-tetraphenylbisimidazole ("B-CIM" produced by Hodogaya Chemical Co., Ltd.).

It is preferable that the component (C) contain at least one of 2,4,5-triarylimidazole dimer from the viewpoint of improvement of sensitivity and adherence as well as better suppression of light absorption by the component (C), and it is more preferable that it contain 2-(2-chlorophenyl)-4,5-diphenylimidazole dimer. In this regard, the structure of a 2,4,5-triarylimidazole dimer may be symmetric or asymmetric.

There is no particular restriction on the content of a component (C), insofar as the content is sufficient for the light transmittance at a wavelength of 365 nm of a photosensitive resin layer to be formed from a photosensitive resin composition for projection exposure containing a component (C) can be regulated to not less than 58.0% and not more than 95.0%, but 0.01 to 30 parts by mass with respect to 100 parts by mass as the total of the component (A) and the component (B) is preferable, 0.1 to 10 parts by mass is more preferable, 1 to 7 parts by mass is further preferable, 1 to 6 parts by mass is especially preferable, 1 to 5 parts by mass is extremely preferable, and 2 to 5 parts by mass is extremely especially preferable. When the content of a component (C) with respect to 100 parts by mass as the total of the component (A) and the component (B) is 0.01 part by mass or more, the photosensitivity, resolution, and adherence tend to be improved, and when it is 30 parts by mass or less, the resist shape tends to become superior.

[(D) Sensitizing Dye]

It is preferable that a photosensitive resin composition for projection exposure according to the present embodiment preferably further contain a (D) sensitizing dye (hereinafter also referred to as "component (D)"). By containing a component (D), it is possible to effectively utilize an absorption wavelength of active light used for projection exposure.

Examples of a (D) sensitizing dye include a dialkylaminobenzophenone, an anthracene, a coumarin, a xanthone, an oxazole, a benzooxazole, a thiazole, a benzothiazole, a triazole, a stilbene, a triazine, a thiophene, a naphthalimide, a pyrazoline, and a triarylamine. They may be used singly or in combinations of two or more.

Among the above, especially when a photosensitive resin layer is exposed to active light of 340 nm to 430 nm, it is preferable that a component (D) contain a pyrazoline from the viewpoint of improvement of sensitivity and adherence as well as better suppression of light absorption by the component (D).

It is preferable that a pyrazoline be a compound expressed by the following general (III).

[Chemical Formula 2]

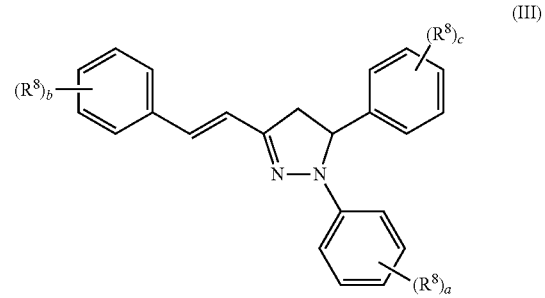

In formula (III), $R^8$ represents an alkyl group having 1 to 12 carbon atoms, or an alkoxy group having 1 to 12 carbon atoms; a, b and c represent independently an integer of 0 to 5; and the sum total of a, b and c is 1 to 6. When the sum total of a, b and c is 2 to 6, a plurality of $R^8$ in the same molecule may be the same or different. $R^8$ may be straight-chain or branched.

In formula (III), it is preferable that at least one of $R^8$ be an alkyl group having 1 to 3 carbon atoms, or an alkoxy group having 1 to 10 carbon atoms from the viewpoint of improvement of solubility in a solvent, an alkyl group having 1 to 3 carbon atoms or an alkoxy group having 1 to 5 carbon atoms is more preferable, and an isopropyl group or a methoxy group is further preferable.

There is no particular restriction on the content of a component (D), insofar as the content is sufficient for the light transmittance at a wavelength of 365 nm of a photosensitive resin layer to be formed from a photosensitive resin composition for projection exposure containing a component (D) can be regulated to not less than 58.0% and not more than 95.0%, but 0.01 to 10 parts by mass with respect to 100 parts by mass as the total of the component (A) and the component (B) is preferable, 0.01 to 5 parts by mass is more preferable, 0.01 to 0.15 part by mass is further preferable, 0.01 to 0.05 part by mass is especially preferable, 0.01 to 0.025 part by mass is extremely preferable, and 0.01 to 0.02 part by mass is most preferable. When the content of a component (D) with respect to 100 parts by mass as the total of the component (A) and the component (B) is 0.01 part by mass or more, high photosensitivity and resolution tend to be obtained, and when the content of a component (D) is 10 parts by mass or less, an adequately superior resist shape tends to be obtained.

(Other Components)

If necessary, a photosensitive resin composition for projection exposure according to the present embodiment may contain a dye, such as malachite green, Victoria pure blue, brilliant green, and methyl violet; a photochromic agent, such as tribromophenyl sulfone, leucocrystal violet, diphenylamine, benzylamine, triphenylamine, diethylaniline, o-chloroaniline, and tert-butylcatechol; a thermal coloring preventing agent; a plasticizer such as p-toluene sulfonamide; an additive, such as a pigment, a filler, an antifoaming agent, a flame retardant, a tackifier, a leveling agent, a detachment promotor, an antioxidant, a fragrance, an imaging agent, a thermal cross-linking agent, and a polymerization inhibitor, at approx. 0.01 to 20 parts by mass each with respect to 100 parts by mass as the total of the component (A) and the component (B). The additives may be used singly or in combinations of two or more.

If necessary, a photosensitive resin composition for projection exposure according to the present embodiment may contain at least one of organic solvent. As the organic solvent, any organic solvent used ordinarily may be used without any particular restriction. Specific examples thereof include an organic solvent, such as methanol, ethanol, acetone, methyl ethyl ketone, methyl cellosolve, ethyl cellosolve, toluene, N,N-dimethyl formamide, and propylene glycol monomethyl ether, or a mixed solvent of the same.

A photosensitive resin composition for projection exposure according to the present embodiment may be used, for example, as a solution with a solid content of 30 to 60 mass-% (hereinafter also referred to as "coating liquid") prepared by dissolving a (A) binder polymer, a (B) photopolymerizing compound having an ethylenically unsaturated bond, a (C) photopolymerization initiator, and a (D) sensitizing dye in an organic solvent. When the solid content of a coating liquid is 30 to 60 mass-%, a defect tends to appear less frequently during formation of a photosensitive resin layer.

By coating the coating liquid, for example, by a publicly known coating method on to a surface of a support, such as a support film, and a metal plate, and drying, a photosensitive resin layer originated from a photosensitive resin composition for projection exposure may be formed on a support.

As a support film, for example, a film of a polymer with thermal resistance and solvent resistance, such as polyethylene terephthalate, polypropylene, polyethylene, and polyester, may be used. Examples of a metal plate include metal plates made of copper, a copper alloy, nickel, chromium, iron, and an iron alloy such as stainless steel, and among them a metal plate made of copper, a copper alloy, or an iron alloy is preferable. Further, a side (surface) opposite to the side facing a support for a photosensitive resin layer may be covered with a protection layer. As a protection layer, it is preferable that a film of a polymer, such as polyethylene, and polypropylene be used.

Although the thickness of a photosensitive resin layer for projection exposure formed using a photosensitive resin composition for projection exposure according to the present embodiment (hereinafter may also be simply abbreviated as "photosensitive resin layer") varies depending on its use, it is preferable that the thickness after drying be 1 to 200 µm. When the thickness of a photosensitive resin layer is 1 µm or more, coating on an industrial scale becomes easy and the productivity tends to be improved. Meanwhile, when the thickness of a photosensitive resin layer is 200 µm or less, a resist pattern, for which the photosensitivity is high, the light curability at a resist base is superior, the resist shape is favorable, the occurrence of resist footing is reduced, and the aspect ratio is high, tends to be formed. It is preferable that the thickness of a photosensitive resin layer in terms of thickness after drying, be 100 µm or less from the viewpoint of more superior resolution, 50 µm or less is more preferable, less than 30 µm is further preferable, and 25 µm or less is especially preferable. Although there is no particular restriction on the lower limit of the thickness of a photosensitive resin layer, insofar as a photosensitive resin layer may be formed, 1 µm or more in terms of thickness after drying is preferable, 5 µm or more is more preferable, and 7 µm or more is further preferable. In a case where a photosensitive resin layer is used as a resist to be used for plating, it is preferable that the thickness after drying be 50 to 200 µm from the viewpoint of superior plating height, interpost distance, and resolution.

The light transmittance of the photosensitive resin layer at a wavelength of 365 nm is not less than 58.0% and not more than 95.0%, not less than 60.0% and not more than 90.0% is preferable, and not less than 65.0% and not more than 88.0% is more preferable. When the light transmittance is 58.0% or more, a sufficient crosslink density is apt to be obtained even at a resist pattern base, so that deterioration of the resist shape, and the occurrence of resist footing may be suppressed. When the light transmittance is 95.0% or less, reflected light from the resist pattern base may be suppressed, so that the resolution may be superior.

In the present embodiment a light transmittance of a photosensitive resin layer at a wavelength of 365 nm is a value measured with a spectrophotometer U-3310 (produced by Hitachi High-Technologies Corp.) setting a slit at 4 nm, a scanning speed at 600 nm/min by placing a base material, on which the photosensitive resin layer is formed, on a reference light side. Meanwhile, a light transmittance may be also measured by reference to JIS K 0115 (2004). When a light transmittance is measured with a spectrophotometer, a light transmittance of a photosensitive resin layer may be calculated through conversion referring to a result of a measurement using only a base material. In the case of a photosensitive element described below, a base material may be used as a support. A light transmittance measured by the above method is a value calculated by inclusion of the amount of light scattered at a photosensitive resin layer, and a base material, namely it can also be deemed to be a value without base line correction for scattering light.

A photosensitive resin composition for projection exposure according to the present embodiment may be favorably used for forming a resist pattern and manufacturing a photosensitive element and a printed wiring board, etc.

<Photosensitive Element>

A photosensitive element according to the present embodiment relates to a photosensitive element comprising a support and a photosensitive resin layer formed on the support and using the photosensitive resin composition for projection exposure. A photosensitive element according to the present embodiment will be described below in detail.

As a support, a film of a polymer (support film) with thermal resistance and solvent resistance, such as polyethylene terephthalate, polypropylene, polyethylene, and polyester, may be used.

It is preferable that the thickness of a support in a photosensitive element be 1 to 100 µm, 1 to 50 µm is more preferable, and 1 to 30 µm is further preferable. When the thickness of a support is 1 µm or more, breakage of a support when the support is detached may be suppressed. When the thickness of a support is 100 µm or less, deterioration of resolution may be suppressed.

The thickness of a photosensitive resin layer in a photosensitive element may be selected appropriately in accordance with its use, and it is preferable that the thickness after drying be 1 to 200 µm. When the thickness of a photosensitive resin layer is 1 µm or more, coating on an industrial scale becomes easy and the productivity tends to be improved. Meanwhile, when the thickness of a photosensitive resin layer is 200 µm or less, a resist pattern, for which the photosensitivity is high, the light curability at a resist base is superior, the resist shape is favorable, the occurrence of resist footing is reduced, and the aspect ratio is high, tends to be formed. Especially, when it is used for forming a resist pattern through exposure using a projection exposure method, it is preferable that the thickness of a photosensitive resin layer in a photosensitive element in terms of thickness after drying be 100 µm or less from the viewpoint of more superior resolution, 50 µm or less is more preferable, less than 30 µm is further preferable, and 25 µm or less is especially preferable. Although there is no particular restriction on the lower limit of the thickness, insofar as a photosensitive resin layer may be formed, 1 µm or more in terms of thickness after drying is preferable, 5 µm or more is more preferable, and 7 µm or more is further preferable. In a case where a photosensitive resin layer is used as a resist to be used for plating, it is preferable that the thickness after drying be 50 to 200 µm from the viewpoint of superior plating height, interpost distance, and resolution.

A photosensitive element according to the present embodiment may further include, if necessary, a protection layer, a cushion layer, an adhesion layer, a light absorption layer, and a middle layer such as a gas barrier layer. For example, as shown in FIG. 1, a photosensitive element 1 according to the present embodiment is provided with a support 2, and a photosensitive resin layer 3 for projection exposure formed on the support 2, and may be provided further with a protection layer 4 covering a side (surface) opposite to the side facing the support 2 of the photosensitive resin layer 3 for projection exposure.

With respect to a protection layer, it is preferable that the adhesive strength to a photosensitive resin layer be less than the adhesive strength to the photosensitive resin layer on a support. Further, a film with low fisheye is preferable. In this regard, a "fisheye" means a foreign substance in a material, an undissolved matter, an oxidatively degraded substance, etc. incorporated in a film, when the film is manufactured, such that a material constituting a protection layer is thermally melted, kneaded, extruded, biaxially stretched, cast, or the like. "Low fisheye" means that the number of such foreign matters in a film is low.

As a protection layer, for example, a film of a polymer with thermal resistance and solvent resistance, such as polypropylene, polyethylene, and a polyester e.g. polyethylene terephthalate, may be used. Examples of a commercially-supplied film include ALPHAN MA-410, E-200C, produced by Oji Paper Co., Ltd., a polypropylene film produced by Shin-Etsu Film Co., Ltd., and a polyethylene terephthalate film such as PS series, such as PS-25, produced by Teijin Limited. In this regard, a protection layer may be identical with the support.

It is preferable that the thickness of a protection layer be 1 to 100 µm, 5 to 50 µm is more preferable, 5 to 30 µm is further preferable, and 15 to 30 µm is especially preferable. When the thickness of a protection layer is 1 µm or more, breakage of a protection layer may be suppressed, when a photosensitive resin layer for projection exposure and a support are compression bonded to a substrate, while peeling off the protection layer. Meanwhile, it is preferable that the thickness of a protection layer be 100 µm or less from the viewpoint of economy.

A photosensitive element according to the present embodiment may be manufactured, for example, by a manufacturing method comprising a step of preparing a coating liquid by dissolving the photosensitive resin composition for projection exposure in an organic solvent; a step of forming a coated layer by coating the coating liquid on to a support; and a step of forming a photosensitive resin layer by drying the coated layer.

Coating of a coating liquid on to a support may be carried out, for example, by a publicly known method, such as roll coating, comma coating, gravure coating, air-knife coating, die coating, bar coating, and spray coating.

Although there is no particular restriction on a method of drying a coated layer, insofar as at least a part of an organic solvent may be removed from a coated layer, drying between 70 and 150° C. for 5 to 30 min is preferable. It is preferable that the amount of the remaining organic solvent in a photosensitive resin layer after drying be 2 mass-% or less from the viewpoint of prevention of diffusion of an organic solvent in a downstream step.

There is no particular restriction on the form of a photosensitive element according to the present embodiment. For example, it may be sheet-formed, or wound-up around a reel. When it is wound up as a roll, it is preferable that it be wound up such that a support is exposed outward. Examples of a reel include a reel of a plastic, such as a polyethylene resin, a polypropylene resin, a polystyrene resin, a polyvinyl chloride resin, and an ABS (acrylonitrile-butadiene-styrene copolymer).

It is preferable to place an end face separator at the end face of the thus obtained roll-shaped photosensitive element roll from the viewpoint of protection of an end face, and also preferable to place a moisture proof end face separator from the viewpoint of resistance to edge fusion. With respect to a packaging method, it is preferable that it be wrapped in a black sheet with a low moisture permeability.

A photosensitive element according to the present embodiment may be favorably used for forming a resist pattern, etc.

Although favorable embodiments of the present invention have been described above, the present invention should not be restricted in any way by the embodiments.

EXAMPLES

The present invention will be described more specifically by way of examples below, provided that the present invention be not restricted in any way by the examples.

[Preparation of Photosensitive Resin Composition for Projection Exposure]

At first, the binder polymers (A-1) and (A-2) shown in the following Tables 1 and 2 were synthesized according to Synthesis examples 1 and 2 respectively.

Synthesis Example 1

As comonomers 125 g of methacrylic acid, 25 g of methyl methacrylate, 125 g of benzyl methacrylate, and 225 g of styrene, and 1.5 g of azobisisobutyronitrile were mixed to prepare a solution a.

Further, in 100 g of a mixture liquid of 60 g of methyl cellosolve, and 40 g of toluene (mass ratio 3:2), 1.2 g of azobisisobutyronitrile was dissolved to prepare a solution b.

Separately, into a flask provided with a stirrer, a reflux condenser, a thermometer, a dropping funnel, and a nitrogen gas feed tube, 400 g of a mixture liquid containing methyl cellosolve and toluene at a mass ratio of 3:2 (hereinafter also referred to as "mixture liquid x") was charged and heated with stirring to 80° C. while blowing a nitrogen gas in.

The solution a was dropped at a constant dropping speed over 4 hours into the 400 g of mixture liquid x in the flask and then stirred at 80° C. for 2 hours. Next, the solution b was dropped at a constant dropping speed over 10 min into the solution in the flask, then the solution in the flask was stirred at 80° C. for 3 hours. The temperature of the solution in the flask was raised over 30 min up to 90° C., kept at 90° C. for 2 hours, and then cooled to room temperature to obtain a solution of a binder polymer (A-1). The mixture liquid x was added to the solution of a binder polymer (A-1) to adjust the content of a nonvolatile component (solid content) to 50 mass-%. The weight-average molecular weight of the binder polymer (A-1) was 50000, and the acid value was 163 mgKOH/g.

An acid value was measured by a neutralization titration method. Specifically, 30 g of acetone was added to 1 g of a solution of the binder polymer (A-1) to be dissolved more uniformly, and then a reasonable quantity of phenolphthalein as an indicator was added to the binder polymer solution and an acid value was measured by titration with a 0.1 N KOH aqueous solution. An acid value was also measured with respect to a binder polymer (A-2) synthesized in Synthesis example 2 by the identical method.

Synthesis Example 2

As comonomers 125 g of methacrylic acid, 25 g of methyl methacrylate, 125 g of phenoxyethyl methacrylate, and 225 g of styrene, and 1.5 g of azobisisobutyronitrile were mixed to prepare a solution c.

Further, in 100 g of a mixture liquid of 60 g of methyl cellosolve, and 40 g of toluene (mass ratio 3:2), 1.2 g of azobisisobutyronitrile was dissolved to prepare a solution d.

Separately, into a flask provided with a stirrer, a reflux condenser, a thermometer, a dropping funnel, and a nitrogen gas feed tube, 400 g of a mixture liquid x was charged and heated with stirring to 80° C. while blowing a nitrogen gas in.

The solution c was dropped at a constant dropping speed over 4 hours into the 400 g of mixture liquid x in the flask and then stirred at 80° C. for 2 hours. Next, the solution d was dropped at a constant dropping speed over 10 min into the solution in the flask, then the solution in the flask was stirred at 80° C. for 3 hours. The temperature of the solution in the flask was raised over 30 min up to 90° C., kept at 90° C. for 2 hours, and then cooled to room temperature to obtain a solution of a binder polymer (A-2). The mixture liquid x was added to the solution of a binder polymer (A-2) to adjust the content of a nonvolatile component (solid content) to 50 mass-%. The weight-average molecular weight of the binder polymer (A-2) was 50000, and the acid value was 163 mgKOH/g.

Examples 1 to 7, and Comparative Examples 1 to 8

Each of components shown in the following Tables 1 and 2 was mixed at an amount set forth in the same tables (unit: parts by mass) to obtain a photosensitive resin composition for projection exposure for Examples 1 to 7, and Comparative Examples 1 to 8. In this regard, the contents of a component (A), and a component (B) in Tables 1 and 2 are both contents of solids.

TABLE 1

| | | Examples | | | | | | |
|---|---|---|---|---|---|---|---|---|
| Components | | 1 | 2 | 3 | 4 | 5 | 6 | 7 |
| Component (A) | (A-1)*[1] | 55 | 55 | 55 | 55 | 55 | 55 | — |
| | (A-2)*[2] | — | — | — | — | — | — | 55 |
| Component (B) | FA-024M*[3] | 5 | 5 | 5 | 5 | 5 | 5 | 5 |
| | FA-321M*[4] | 30 | 30 | 30 | 30 | 30 | 30 | 30 |
| | BPE-200*[5] | 10 | 10 | 10 | 10 | 10 | 10 | 10 |
| Component (C) | B-CIM*[6] | 2.9 | 2.9 | 2.9 | 2.9 | 2.9 | 2.9 | 2.9 |
| Component (D) | Pyrazoline compound*[7] | 0.025 | 0.02 | 0.01 | — | 0.02 | 0.02 | 0.02 |
| | EAB*[8] | — | — | — | — | — | — | — |
| Additives | Leucocrystal violet | 0.5 | 0.5 | 0.5 | 0.5 | 0.5 | 0.5 | 0.5 |
| | Malachite green | 0.05 | 0.05 | 0.05 | 0.05 | 0.05 | 0.05 | 0.05 |
| Organic solvents | Acetone | 10 | 10 | 10 | 10 | 10 | 10 | 10 |
| | Toluene | 10 | 10 | 10 | 10 | 10 | 10 | 10 |
| | Methanol | 10 | 10 | 10 | 10 | 10 | 10 | 10 |

TABLE 2

| | | Comparative Examples | | | | | | | |
|---|---|---|---|---|---|---|---|---|---|
| Components | | 1 | 2 | 3 | 4 | 5 | 6 | 7 | 8 |
| Component (A) | (A-1)*[1] | 55 | 55 | 55 | 55 | 55 | — | 55 | 55 |
| | (A-2)*[2] | — | — | — | — | — | 55 | — | — |
| Component (B) | FA-024M*[3] | 5 | 5 | 5 | 5 | 5 | 5 | 5 | 5 |
| | FA-321M*[4] | 30 | 30 | 30 | 30 | 30 | 30 | 30 | 30 |
| | BPE-200*[5] | 10 | 10 | 10 | 10 | 10 | 10 | 10 | 10 |

TABLE 2-continued

|  | Components | Comparative Examples | | | | | | | |
| --- | --- | --- | --- | --- | --- | --- | --- | --- | --- |
|  |  | 1 | 2 | 3 | 4 | 5 | 6 | 7 | 8 |
| Component (C) | B-CIM*6 | 2.9 | 2.9 | 2.9 | 2.9 | 2.9 | 2.9 | 2.9 | 2.9 |
| Component (D) | Pyrazoline compound*7 | 0.18 | 0.12 | 0.12 | 0.25 | — | 0.18 | 0.06 | — |
|  | EAB*8 | — | — | — | — | 0.16 | — | — | 0.04 |
| Additives | Leucocrystal violet | 0.5 | 0.5 | 0.5 | 0.5 | 0.5 | 0.5 | 0.5 | 0.5 |
|  | Malachite green | 0.05 | 0.05 | 0.05 | 0.05 | 0.05 | 0.05 | 0.05 | 0.05 |
| Organic solvents | Acetone | 10 | 10 | 10 | 10 | 10 | 10 | 10 | 10 |
|  | Toluene | 10 | 10 | 10 | 10 | 10 | 10 | 10 | 10 |
|  | Methanol | 10 | 10 | 10 | 10 | 10 | 10 | 10 | 10 |

The details of each component in Tables 1 and 2 are as follows. Component (A): binder polymer
1: (A-1) (Binder polymer (A-1) obtained in Synthesis example 1)
Methacrylic acid/methyl methacrylate/benzyl methacrylate/styrene=25/5/25/45 (mass ratio), weight-average molecular weight=50000, solid content=50 mass-%, methyl cellosolve/toluene=3/2 (mass ratio) solution
2: (A-2) (Binder polymer (A-2) obtained in Synthesis example 2)
Methacrylic acid/methyl methacrylate/phenoxyethyl methacrylate/styrene=25/5/25/45 (mass ratio), weight-average molecular weight=50000, solid content=50 mass-%, methyl cellosolve/toluene=3/2 (mass ratio) solution
Component (B): photopolymerizing compound having ethylenically unsaturated bond
3: FA-024M (product name, produced by Hitachi Chemical Co., Ltd.)
EOPO modified dimethacrylate
4: FA-321M (product name, produced by Hitachi Chemical Co., Ltd.)
2,2-bis(4-((meth)acryloxypentaethoxy)phenyl)propane
5: BPE-200 (product name, produced by Shin-Nakamura Chemical Co., Ltd.)
2,2-bis(4-((meth)acryloxydipropoxy)phenyl)propane
Component (C): photopolymerization initiator
6: B-CIM (product name, produced by Hodogaya Chemical Co., Ltd.)
2,2'-bis(2-chlorophenyl)-4,4',5,5'-tetraphenyl bisimidazole
Component (D): sensitizing dye
7: pyrazoline compound (produced by Nippon Chemical Industrial Co., Ltd., compound name: 1-phenyl-3-(4-methoxystyryl)-5-(4-methoxyphenyl)pyrazoline)
8: EAB (product name, produced by Hodogaya Chemical Co., Ltd.)
4,4'-bis(diethylamino)benzophenone

[Production of Photosensitive Element and Evaluation of Characteristics of Photosensitive Resin Layer]
(Production of Photosensitive Element)
Each of the photosensitive resin compositions for projection exposure obtained in Examples 1 to 7 and Comparative Examples 1 to 8 was coated uniformly on a 16 μm-thick polyethylene terephthalate film (product name "FB40", produced by Toray Industries, Inc.) (a support), dried in a hot air convection drier at 100° C. for 10 min to form a photosensitive resin layer with a film thickness after drying of 7 μm, 25 μm, or 56 μm as shown in Tables 3 and 4.
On the formed photosensitive resin layer, a polypropylene film (product name "NF-15", produced by Tamapoly Co., Ltd.) (a protection layer) was bonded to obtain a photosensitive element, in which a support, a photosensitive resin layer, and a protection layer are layered in the mentioned order.

(Measurement of Light Transmittance)
After detaching the protection layer of the photosensitive element, the light transmittance of a photosensitive resin layer at a wavelength of 365 nm was measured with a spectrophotometer U-3310 (product name, produced by Hitachi High-Technologies Corp.) using a polyethylene terephthalate film (a support) as a reference. The measurement was carried out with a setup of a slit at 4 nm, and a scanning speed at 600 nm/min. The results are shown in Tables 3 and 4.

(Production of Layered Body)
A copper surface of a copper-clad laminated board, which is constituted with a glass epoxy material and 12 μm-thick copper foils layered on both sides thereof (a substrate, product name "MCL-E-67", produced by Hitachi Chemical Co., Ltd.) was polished with a polishing machine provided with a brush equivalent to #600 (produced by SANKEI Co., Ltd.), washed with water, and then dried in an airstream. The polished copper-clad laminated board was warmed to 80° C., and each of the photosensitive element was compression bonded onto the copper-clad laminated board such that, while a protection layer being peeled off, a photosensitive resin layer came into direct contact with the copper surface. Compression bonding was conducted with a heat roll at 110° C. at a roll speed of 1.5 m/min applying a pressure of 0.40 MPa.

Thus, each layered body, in which a copper-clad laminated board, a photosensitive resin layer, and a support were layered one on another in the order mentioned, was obtained. The obtained layered body was left standing to cool down to room temperature, and used as a specimen in tests described below.

(Evaluation of Photosensitivity)
The obtained specimen was divided in 3 regions, and on a support of one of the regions a Hitachi 41-step tablet with a density range of 0.00 to 2.00, a density step of 0.05, a tablet size of 20 mm×187 mm, and each step size of 3 mm×12 mm was placed. As for exposure, a photosensitive resin layer was exposed to an energy dose (exposure dose) of 100 mJ/cm$^2$ using a projection exposure device (product name "UX-2240SMXJ-01", produced by Ushio, Inc.) with a light source of a semiconductor laser of a wavelength of 365 nm. In doing so, other regions not used were covered with a black sheet. Each of the other regions was exposed to an energy dose of 150 mJ/cm$^2$, or 200 mJ/cm$^2$ by the same method. A measurement of the illuminance was made with an ultraviolet light illuminance meter (product name "UIT-250", produced by Ushio, Inc.) equipped with a probe corresponding to 365 nm, and a photoreceiver (product name "UVD-S365", produced by Ushio, Inc.).

Next, a development treatment was conducted, in which a support was detached from a specimen, and a photosensitive resin layer was subjected to spray development for 2 times as long as the shortest development time (shortest time required for removal of unexposed part) using a 1.0 mass-% sodium carbonate aqueous solution at 30° C. to remove an unexposed part. In this way a resist pattern composed of a photocured product of a photosensitive resin composition for projection exposure was formed on a copper surface of a copper-clad laminated board. In this regard, the shortest development time was determined by measuring a time when a photosensitive resin layer at an unexposed part was completely removed by the development treatment.

After a development treatment, the number of remaining steps (step number) of a step tablet of a photocured product (resist pattern) formed on a copper-clad laminated board at each exposure dose was measured. Next, a calibration curve between an exposure dose and a step number was prepared, and an exposure dose (unit: mJ/cm$^2$) to give a step number of 11 was determined for evaluating the sensitivity of a photosensitive resin composition. The lower exposure dose means the higher sensitivity. The results are shown in Tables 3 and 4.

(Evaluation of Adherence)

A mask having a wiring pattern with a line width/space width (hereinafter may be referred to as "L/S") of y/3y (y=1 to 30) (unit: μm) as a pattern for evaluating the adherence was placed on a support of the specimen obtained as above, and a photosensitive resin layer was exposed with a projection exposure device (product name "UX-2240SMXJ-01", produced by Ushio, Inc.) with a light source of a semiconductor laser of a wavelength of 365 nm, to an energy dose to give a number of remaining steps of 11 after development with respect to Hitachi 41-step tablet. After the exposure, a development treatment was conducted similarly as the evaluation of photosensitivity.

After a development treatment, a resist pattern was observed using a light microscope. The smallest value of the width (minimum line width, unit: μm) of a line part remained (exposed part) without meandering or chipping, while unexposed parts were removed cleanly by a development treatment, was used as an evaluation index for adherence. The lower value means superior adherence. The results are shown in Tables 3 and 4.

(Evaluation of Resolution)

A mask having a wiring pattern with a L/S of z/z (z=1 to 30) (unit: μm) as a pattern for evaluating the resolution was placed on a support of the specimen obtained as above, and a photosensitive resin layer was exposed with a projection exposure device (product name "UX-2240SMXJ-01", produced by Ushio, Inc.) with a light source of a semiconductor laser of a wavelength of 365 nm, to an energy dose to give a number of remaining steps of 11 after development with respect to Hitachi 41-step tablet. After the exposure, a development treatment was conducted similarly as the evaluation of photosensitivity.

After a development treatment, a resist pattern was observed using a light microscope. The smallest value of the space width (minimum space width, unit: μm) between line parts (exposed parts), in which unexposed parts were removed completely by a development treatment, was used as an evaluation index for resolution. The lower value means superior resolution. The results are shown in Tables 3 and 4.

(Evaluation of Aspect Ratio)

At the line part, where the width of a resist pattern formed for the evaluation of adherence is minimum, a height from a surface of a copper-clad laminated board (hereinafter also referred to as "line height") was measured. The line height (unit: μm) was divided by the minimum line width (unit: μm) measured for the evaluation of adherence to calculate an aspect ratio (line height/minimum line width). The results are shown in Tables 3 and 4.

(Evaluation of Resist Shape)

The resist shape was evaluated by observing a part of a resist pattern formed for the evaluation of adherence, where a line with a width of 10 μm was formed. The resist shape was evaluated according to the following criteria by observing a resist shape with a scanning electron microscope (SEM) (product name "SU-1500", produced by Hitachi High-Technologies Corp.) with an acceleration voltage of 15 kV, at a magnification of 2000×, and a tilt angle of 60 degrees. The resist shape rated as "A" when the maximum width difference between the top of a resist and the base of a resist was less than 1.0 μm, as "B" when not less than 1.0 μm and less than 1.5 μm, as "C" when not less than 1.5 μm and less than 2.0 μm, and as "D" when not less than 2.0 μm. The results are shown in Tables 3 and 4.

(Evaluation of Resist Footing)

Figure 3:
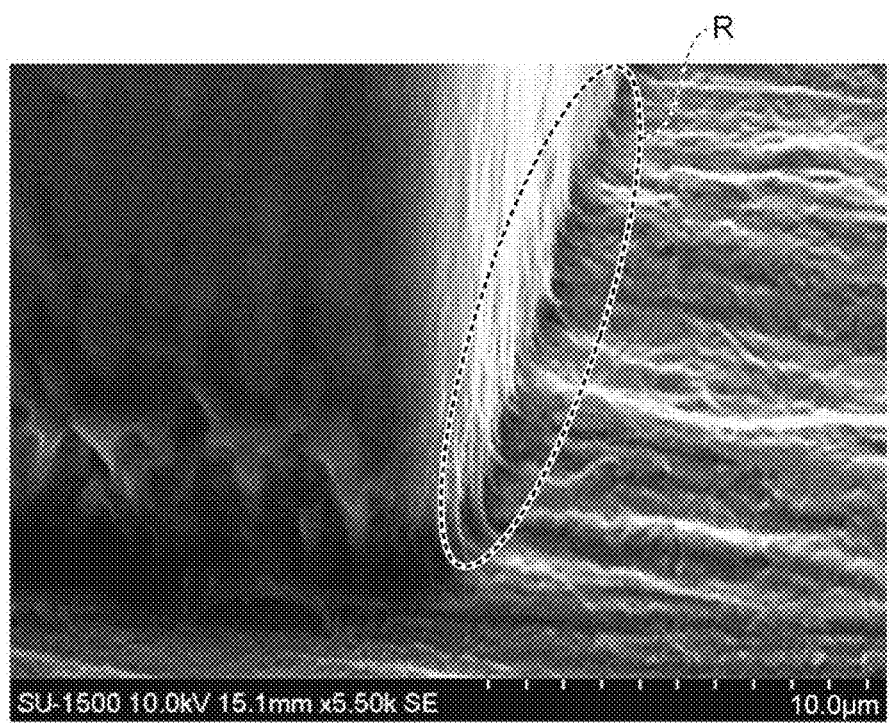
FIG. 3 is a scanning electron micrograph (SEM) of a resist pattern formed in Example 2.
Figure 4:
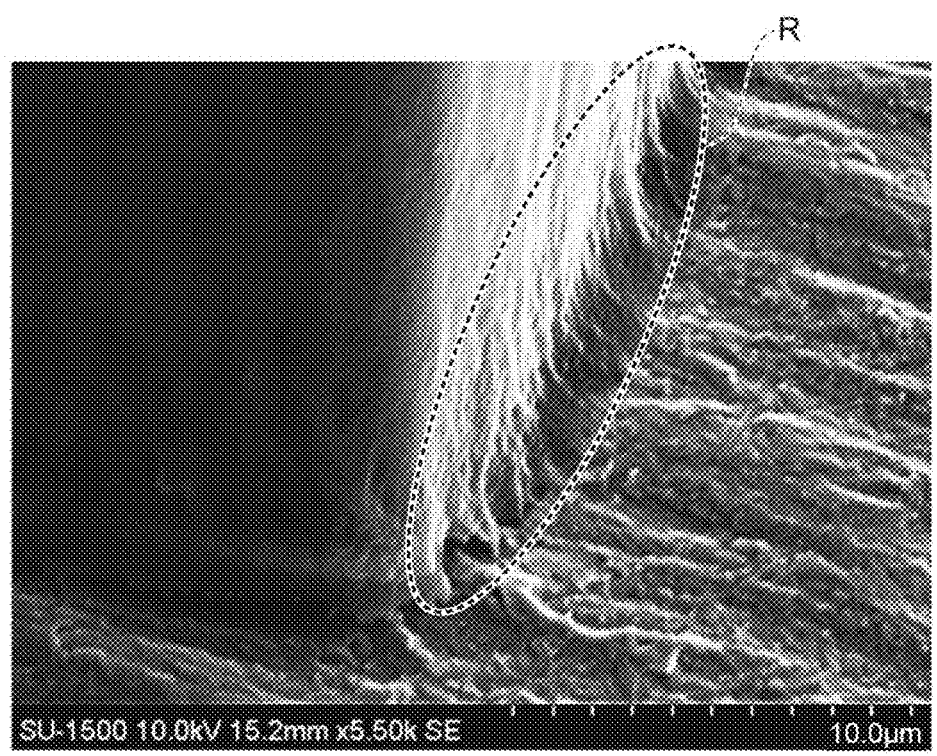
FIG. 4 is a scanning electron micrograph (SEM) of a resist pattern formed in Comparative Example 2.

The resist footing was evaluated by observing a line part with a line width of 20 μm, of a resist pattern having been formed for the evaluation of adherence. The resist footing was evaluated according to the following criteria by observing a resist shape with a scanning electron microscope (SEM) (product name "SU-1500", produced by Hitachi High-Technologies Corp.) with an acceleration voltage of 10 kV, at a magnification of 5500×, and a tilt angle of 45 degrees. The footing was rated as "A" when the maximum length of the footing occurring from the resist side and the resist base was less than 1.0 μm, as "B" when not less than 1.0 μm and less than 1.5 μm, as "C" when not less than 1.5 μm and less than 2.0 μm, and as "D" when not less than 2.0 μm. The results are shown in Tables 3 and 4. SEM micrographs of observation of resist patterns of Example 2 and Comparative Example 2 are shown in FIG. 3 and FIG. 4 respectively. The encircled parts R in FIG. 3 and FIG. 4 are resist footing (residue).

TABLE 3

| Characteristics | Examples | | | | | | |
| --- | --- | --- | --- | --- | --- | --- | --- |
|  | 1 | 2 | 3 | 4 | 5 | 6 | 7 |
| Thickness of photosensitive resin layer (μm) | 25 | 25 | 25 | 25 | 56 | 7 | 25 |
| Photosensitivity (mJ/cm$^2$) | 130 | 130 | 130 | 130 | 160 | 120 | 130 |
| Light transmittance (%) | 62.5 | 65.8 | 67.9 | 70.1 | 58.0 | 84.8 | 65.8 |
| Resolution (μm) | 10 | 10 | 10 | 10 | 25 | 5 | 10 |
| Adherence (μm) | 9 | 9 | 9 | 10 | 15 | 5 | 10 |
| Aspect ratio | 2.8 | 2.8 | 2.8 | 2.5 | 3.7 | 1.4 | 2.5 |
| Resist shape | B | A | A | A | A | A | B |
| Resist footing | B | A | A | A | A | A | B |

TABLE 4

| Characteristics | Comparative Examples | | | | | | | |
| --- | --- | --- | --- | --- | --- | --- | --- | --- |
|  | 1 | 2 | 3 | 4 | 5 | 6 | 7 | 8 |
| Thickness of photosensitive resin layer (μm) | 25 | 25 | 56 | 7 | 25 | 25 | 25 | 25 |

TABLE 4-continued

| | Comparative Examples | | | | | | | |
|---|---|---|---|---|---|---|---|---|
| Characteristics | 1 | 2 | 3 | 4 | 5 | 6 | 7 | 8 |
| Photosensitivity (mJ/cm$^2$) | 110 | 110 | 130 | 100 | 130 | 100 | 120 | 130 |
| Light transmittance (%) | 33.7 | 46.2 | 25.6 | 45.2 | 25.1 | 33.7 | 57.2 | 57.5 |
| Resolution (μm) | 12 | 12 | 25 | 6 | 12 | 12 | 10 | 10 |
| Adherence (μm) | 10 | 10 | 20 | 6 | 12 | 10 | 10 | 10 |
| Aspect ratio | 2.5 | 2.5 | 2.8 | 1.2 | 2.1 | 2.5 | 2.5 | 2.5 |
| Resist shape | D | C | C | D | D | D | B | B |
| Resist footing | D | D | D | C | C | D | C | C |

As obvious from the results shown in Table 3 and Table 4, it has been confirmed that resist patterns formed with photosensitive resin compositions for projection exposure of Examples 1 to 7, for which the light transmittance at a wavelength of 365 nm is not less than 58.0% and not more than 95.0%, exhibit superior resist shape and reduced occurrence of resist footing compared to Comparative Examples 1 to 8; and that, when cases with similar thicknesses of photosensitive resin layers are compared, the adherence, resolution, and aspect ratio are improved in Examples 1 to 7 compared to Comparative Examples 1 to 8.

INDUSTRIAL APPLICABILITY

As described above, according to the present invention, a method for forming a resist pattern, a method for manufacturing a printed wiring board, a photosensitive resin composition for projection exposure, and a photosensitive element, able to form a resist pattern, in which the resist shape is favorable, the occurrence of resist footing (generation of residue) can be reduced, and the adherence and the aspect ratio are improved, even when a resist pattern is formed using a projection exposure method, may be provided.

REFERENCE SIGNS LIST

1 . . . photosensitive element, 2 . . . support, 3, 32 . . . photosensitive resin layer for projection exposure, 4 . . . protection layer, 10 . . . conductor layer, 15 . . . insulation layer, 30 . . . resist pattern, 40 . . . circuit pattern, 42 . . . plated layer, 50 . . . active light.

The invention claimed is:

1. A method for forming a resist pattern comprising:
a step of forming a photosensitive resin layer on a substrate using a photosensitive resin composition for projection exposure;
a step of exposing the photosensitive resin layer to active light projecting an image of a photomask through a lens; and
a step of removing an unexposed part of the photosensitive resin layer from the substrate by development;
wherein the photosensitive resin composition for projection exposure comprises an (A) binder polymer, a (B) photopolymerizing compound having an ethylenically unsaturated bond, a (C) photopolymerization initiator, and a (D) sensitizing dye comprising a pyrazoline, wherein a content of the (D) sensitizing dye in the photosensitive resin composition is 0.01 to 0.02 parts by mass with respect to 100 parts by mass as the total of the (A) binder polymer, and the (B) photopolymerizing compound having an ethylenically unsaturated bond; and
a light transmittance of the photosensitive resin layer at a wavelength of 365 nm is not less than 58.0% and not more than 95.0%.

2. The method for forming a resist pattern according to claim 1, wherein a content of the (C) photopolymerization initiator in the photosensitive resin composition is 0.01 to 30 parts by mass with respect to 100 parts by mass as the total of the (A) binder polymer and the (B) photopolymerizing compound having an ethylenically unsaturated bond.

3. A method for manufacturing a printed wiring board comprising a step of forming a conductor pattern by performing an etching treatment or a plating treatment on a substrate with a resist pattern formed by the method for forming a resist pattern according to claim 1.

4. The method for forming a resist pattern according to claim 1, wherein the (D) sensitizing dye is a pyrazoline.

5. The method for forming a resist pattern according to claim 4, wherein the (D) sensitizing dye is a compound expressed by the following general (III):

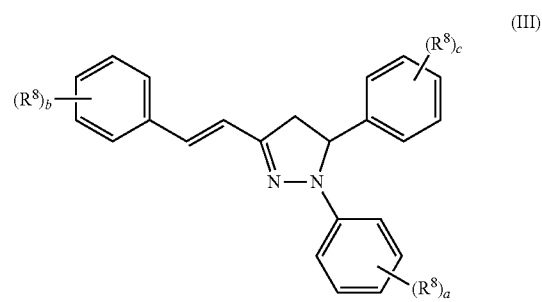

wherein R$^8$ represents an alkyl group having 1 to 12 carbon atoms, or an alkoxy group having 1 to 12 carbon atoms; a, b and c represent independently an integer of 0 to 5, the sum total of a, b and c is 1 to 6, and, if the sum total of a, b and c is 2 to 6, a plurality of R$^8$ in the same molecule may be the same or different.

6. The method for forming a resist pattern according to claim 5, wherein at least one of R$^8$ is an alkyl group having 1 to 3 carbon atoms or an alkoxy group having 1 to 10 carbon atoms.

7. The method for forming a resist pattern according to claim 5, wherein at least one of R$^8$ is an alkyl group having 1 to 3 carbon atoms or an alkoxy group having 1 to 5 carbon atoms.

8. The method for forming a resist pattern according to claim 5, wherein at least one of R$^8$ is an isopropyl group or a methoxy group.

9. The method for forming a resist pattern according to claim 1, wherein the pyrazoline is a compound expressed by the following general (III):

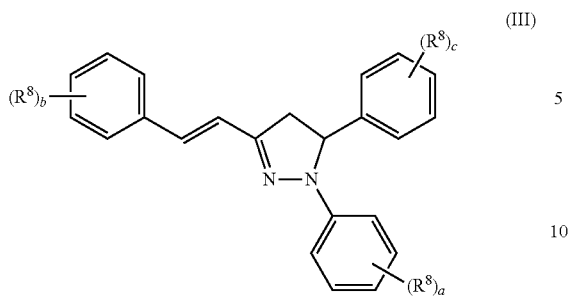

(III)

wherein $R^8$ represents an alkyl group having 1 to 12 carbon atoms, or an alkoxy group having 1 to 12 carbon atoms; a, b and c represent independently an integer of 0 to 5, the sum total of a, b and c is 1 to 6, and, if the sum total of a, b and c is 2 to 6, a plurality of $R^8$ in the same molecule may be the same or different.

10. The method for forming a resist pattern according to claim 9, wherein at least one of $R^8$ is an alkyl group having 1 to 3 carbon atoms or an alkoxy group having 1 to 10 carbon atoms.

11. The method for forming a resist pattern according to claim 9, wherein at least one of $R^8$ is an alkyl group having 1 to 3 carbon atoms or an alkoxy group having 1 to 5 carbon atoms.

12. The method for forming a resist pattern according to claim 9, wherein at least one of $R^8$ is an isopropyl group or a methoxy group.

* * * * *